US012813094B2

(12) United States Patent
Shin et al.

(10) Patent No.: US 12,813,094 B2
(45) Date of Patent: Nov. 24, 2026

(54) DISPLAY DEVICE INCLUDING MULTILAYER ELECTRODE STRUCTURE, ELECTRONIC DEVICE INCLUDING THE DISPLAY DEVICE AND METHOD OF MANUFACTURING THE DEVICE

(71) Applicant: SAMSUNG DISPLAY CO., LTD., Yongin-si (KR)

(72) Inventors: Hyuneok Shin, Yongin-si (KR); Dokeun Song, Yongin-si (KR); Joonyong Park, Yongin-si (KR); Sukyoung Yang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 357 days.

(21) Appl. No.: 18/229,548

(22) Filed: Aug. 2, 2023

(65) Prior Publication Data

US 2024/0179959 A1 May 30, 2024

(30) Foreign Application Priority Data

Nov. 25, 2022 (KR) ........................ 10-2022-0160726

(51) Int. Cl.
*H10K 59/123* (2023.01)
*H10K 59/12* (2023.01)
(Continued)

(52) U.S. Cl.
CPC ....... *H10K 59/123* (2023.02); *H10K 59/1201* (2023.02); *H10K 59/131* (2023.02);
(Continued)

(58) Field of Classification Search
CPC ............. H01L 27/3262; H01L 27/1214; H01L 27/3276; H01L 51/56; H01L 27/1225; H01L 27/124; H01L 29/41733; H01L 29/42384; H01L 27/3248; H01L 21/02063; H01L 27/1251; H01L 27/3258;
(Continued)

(56) References Cited

U.S. PATENT DOCUMENTS 7,897,450 B2 * 3/2011 Koehler ............... H10D 64/693
438/791
7,902,640 B2 * 3/2011 Hsu .................... H10D 30/0316
257/E21.293
(Continued)

FOREIGN PATENT DOCUMENTS

CN 102306708 A 1/2012
JP 5007246 B2 6/2012
(Continued)

*Primary Examiner* — Caleb E Henry
(74) *Attorney, Agent, or Firm* — CANTOR COLBURN LLP

(57) ABSTRACT

A display device includes a substrate including a display area and a peripheral area surrounding the display area, a thin-film transistor disposed on the display area of the substrate, and a pixel electrode disposed on the thin-film transistor and electrically connected to the thin-film transistor. The pixel electrode includes a lower layer including titanium nitride (TiN), an intermediate layer disposed on the lower layer and including an aluminum alloy, and an upper layer disposed on the intermediate layer and including titanium oxide.

19 Claims, 10 Drawing Sheets

(51) Int. Cl.
*H10K 59/131* (2023.01)
*H10K 59/38* (2023.01)
*H10K 71/20* (2023.01)
*H10K 71/60* (2023.01)

(52) U.S. Cl.
CPC ........... *H10K 59/38* (2023.02); *H10K 71/231* (2023.02); *H10K 71/60* (2023.02)

(58) Field of Classification Search
CPC ......... H01L 29/78606; H01L 29/78618; H01L 29/7869; H10K 59/1213; H10K 59/131; H10K 71/00; H10K 59/123; H10K 59/124; H10K 59/1201; H10K 59/38; H10K 71/231; H10K 71/60; H10K 50/818; H10K 50/82; H10K 50/844; H10K 59/80518; H10K 59/873; H10K 59/8052
See application file for complete search history.

(56) References Cited

U.S. PATENT DOCUMENTS

| | | | | |
|---|---|---|---|---|
| 8,040,054 | B2 | 10/2011 | Nagayama et al. | |
| 8,853,698 | B1 * | 10/2014 | Chang | H10D 30/6755 257/350 |
| 9,853,067 | B2 * | 12/2017 | Cai | H10D 86/60 |
| 10,134,912 | B2 * | 11/2018 | Kimura | H10D 30/6713 |
| 10,483,339 | B2 * | 11/2019 | Moon | H10K 59/123 |
| 10,991,784 | B2 * | 4/2021 | Kwon | H10D 30/6729 |
| 2005/0275038 | A1 * | 12/2005 | Shih | H10D 30/6755 257/382 |
| 2006/0157754 | A1 * | 7/2006 | Jeon | H01L 21/02159 438/257 |
| 2006/0234430 | A1 * | 10/2006 | Liu | H10K 10/474 438/149 |
| 2008/0085583 | A1 * | 4/2008 | Park | H10B 41/30 257/E29.302 |
| 2010/0001346 | A1 * | 1/2010 | Ye | H10D 30/6755 257/E21.411 |
| 2012/0161270 | A1 * | 6/2012 | Maehara | B82Y 10/00 257/E31.127 |
| 2013/0270527 | A1 * | 10/2013 | Kwon | H10K 59/126 254/43 |
| 2014/0183528 | A1 * | 7/2014 | Endo | H10D 86/0231 257/43 |
| 2014/0273342 | A1 * | 9/2014 | Yim | H10D 30/6755 438/104 |
| 2014/0361273 | A1 | 12/2014 | Nozawa | |
| 2016/0233251 | A1 * | 8/2016 | Sasaki | H10K 59/1213 |
| 2017/0194415 | A1 * | 7/2017 | Choi | H10K 50/828 |
| 2017/0278977 | A1 * | 9/2017 | Jeong | H10D 30/6755 |
| 2017/0294498 | A1 * | 10/2017 | Kwon | H10D 86/40 |
| 2018/0026055 | A1 * | 1/2018 | Rui | H10D 30/6745 257/71 |
| 2018/0061922 | A1 * | 3/2018 | Kim | H10K 59/1213 |
| 2019/0088793 | A1 * | 3/2019 | Kimura | G09G 3/3648 |
| 2020/0227509 | A1 * | 7/2020 | Yoon | H10K 59/1201 |
| 2020/0258966 | A1 * | 8/2020 | Cha | H10K 59/1216 |
| 2021/0225977 | A1 * | 7/2021 | Kwon | H10D 86/60 |
| 2021/0343811 | A1 * | 11/2021 | Kim | H10K 59/124 |
| 2022/0069255 | A1 * | 3/2022 | You | H10K 59/80517 |
| 2022/0173155 | A1 | 6/2022 | Rho | |
| 2022/0231238 | A1 * | 7/2022 | Okuyama | H10K 85/6572 |
| 2023/0039703 | A1 * | 2/2023 | Lee | H10K 59/124 |
| 2023/0103145 | A1 * | 3/2023 | Choi | H01L 25/0753 257/79 |
| 2023/0209913 | A1 * | 6/2023 | Hu | H10K 59/122 257/40 |
| 2023/0378194 | A1 * | 11/2023 | Liu | G06F 3/0412 |
| 2024/0179935 | A1 * | 5/2024 | Yamazaki | H10K 50/19 |

FOREIGN PATENT DOCUMENTS

| | | | |
|---|---|---|---|
| JP | 2014235958 | A | 12/2014 |
| KR | 1020220026663 | | 3/2022 |
| KR | 1020220077207 | | 6/2022 |

* cited by examiner

Confidential and Privileged

DISPLAY DEVICE INCLUDING MULTILAYER ELECTRODE STRUCTURE, ELECTRONIC DEVICE INCLUDING THE DISPLAY DEVICE AND METHOD OF MANUFACTURING THE DEVICE

This application claims priority to Korean Patent Application No. 10-2022-0160726, filed on Nov. 25, 2022, and all the benefits accruing therefrom under 35 U.S.C. § 119, the content of which in its entirety is herein incorporated by reference.

BACKGROUND

1. Field

Embodiments relate to a display device and a method of manufacturing the display device.

2. Description of the Related Art

Display devices provide visual information, such as images or videos, to users. In accordance with a development of various electronic devices, such as computers and relatively large televisions, various types of display devices applicable thereto are being developed. Recently, electronic devices based on mobility have been widely used, and tablet personal computers ("PCs") are being widely used as portable electronic devices, as well as small electronic devices such as mobile phones.

A display device includes a display area and a non-display area, and a plurality of light-emitting elements is arranged in the display area. A display device may provide images by light emitted by the plurality of light-emitting elements. The light-emitting elements may each include a pixel electrode and an opposite electrode.

SUMMARY

Embodiments include a display device with improved reliability and a method of manufacturing the display device.

Additional features will be set forth in part in the description which follows and, in part, will be apparent from the description, or may be learned by practice of the presented embodiments of the disclosure.

In an embodiment of the disclosure, a display device includes a substrate including a display area and a peripheral area surrounding the display area, a thin-film transistor disposed on the display area of the substrate, and a pixel electrode disposed on the thin-film transistor and electrically connected to the thin-film transistor. The pixel electrode includes a lower layer including titanium nitride (TiN), an intermediate layer disposed on the lower layer and including an aluminum alloy, and an upper layer disposed on the intermediate layer and including titanium oxide.

In an embodiment, the display device may further include a pad portion disposed on the peripheral area of the substrate and including a first pad electrode layer and a second pad electrode layer disposed on the first pad electrode layer. The second pad electrode layer may include a same material as that of the lower layer.

In an embodiment, the second pad electrode layer may contact the first pad electrode layer.

In an embodiment, the thin-film transistor may include a source region and a drain region on the substrate, a gate electrode, a source electrode electrically connected to the source region, and a drain electrode electrically connected to the drain region. The first pad electrode layer may include a same material as that of the source electrode and the drain electrode.

In an embodiment, the lower layer may contact the source electrode or the drain electrode.

In an embodiment, the intermediate layer may include an aluminum-nickel-lanthanum alloy (Al—Ni—La alloy) or an aluminum-titanium alloy (Al—Ti alloy).

In an embodiment, in the Al—Ni—La alloy, a sum of an atomic ratio of Ni and an atomic ratio of La may be in a range of 0.01 at % or more and less than 0.1 at %.

In an embodiment, in the Al—Ti alloy, an atomic ratio of Ti may be in a range of 0.01 at % or more and less than 0.1 at %.

In an embodiment, the display device may further include an emission layer disposed on the pixel electrode, an opposite electrode disposed on the emission layer, and a thin-film encapsulation layer disposed on the opposite electrode.

In an embodiment, the display device may further include red, green and blue color filters disposed on the thin-film encapsulation layer.

In an embodiment, the emission layer may be unitary on the substrate.

In an embodiment, the substrate may include a semiconductor substrate.

In an embodiment of the disclosure, a display device includes a substrate including a display area and a peripheral area surrounding the display area, a thin-film transistor disposed on the display area of the substrate, a pixel electrode disposed on the thin-film transistor and electrically connected to the thin-film transistor, and a pad portion disposed on the peripheral area of the substrate. The pixel electrode includes a lower layer including titanium nitride (TiN), an intermediate layer disposed on the lower layer and including an aluminum alloy, and an upper layer disposed on the intermediate layer and including titanium oxide, and at least a portion of the pad portion includes a same material as that of the lower layer.

In an embodiment, the pad portion may include a first pad electrode layer and a second pad electrode layer disposed on the first pad electrode layer.

In an embodiment, the thin-film transistor may include a source region and a drain region on the substrate, a gate electrode, a source electrode electrically connected to the source region, and a drain electrode electrically connected to the drain region. The first pad electrode layer may include a same material as that of the source electrode and the drain electrode, and the second pad electrode layer may include a same material as that of the lower layer.

In an embodiment, the second pad electrode layer may contact the first pad electrode layer.

In an embodiment, the intermediate layer may include an aluminum-nickel-lanthanum alloy (Al—Ni—La alloy) or an aluminum-titanium alloy (Al—Ti alloy).

In an embodiment, in the Al—Ni—La alloy, a sum of an atomic ratio of Ni and an atomic ratio of La may be in a range of 0.01 at % or more and less than 0.1 at %. In an embodiment, in the Al—Ti alloy, an atomic ratio of Ti may be in a range of 0.01 at % or more and less than 0.1 at %.

In an embodiment, the substrate may include a semiconductor substrate.

In an embodiment of the disclosure, a method of manufacturing a display device includes forming a thin-film transistor on a display area of a substrate, forming, on the thin-film transistor, a lower conductive layer electrically connected to the thin-film transistor and including titanium nitride (TiN), forming, on the lower conductive layer, an intermediate conductive layer including an aluminum alloy, forming, on the intermediate conductive layer, an upper conductive layer including titanium oxide, and forming a pixel electrode by dry-etching the lower conductive layer, the intermediate conductive layer, and the upper conductive layer.

In an embodiment, the method may further include forming a first pad electrode layer on a peripheral area surrounding the display area of the substrate, and forming a second pad electrode layer on the first pad electrode layer. The lower conductive layer, the intermediate conductive layer, and the upper conductive layer may be formed on an entirety of the display area and the peripheral area and disposed on the first pad electrode layer, and the second pad electrode layer may be formed by removing, in the peripheral area, a portion of the lower conductive layer and all of the intermediate conductive layer and the upper conductive layer.

In an embodiment, the intermediate layer may include an aluminum-nickel-lanthanum alloy (Al—Ni—La alloy) or an aluminum-titanium alloy (Al—Ti alloy).

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
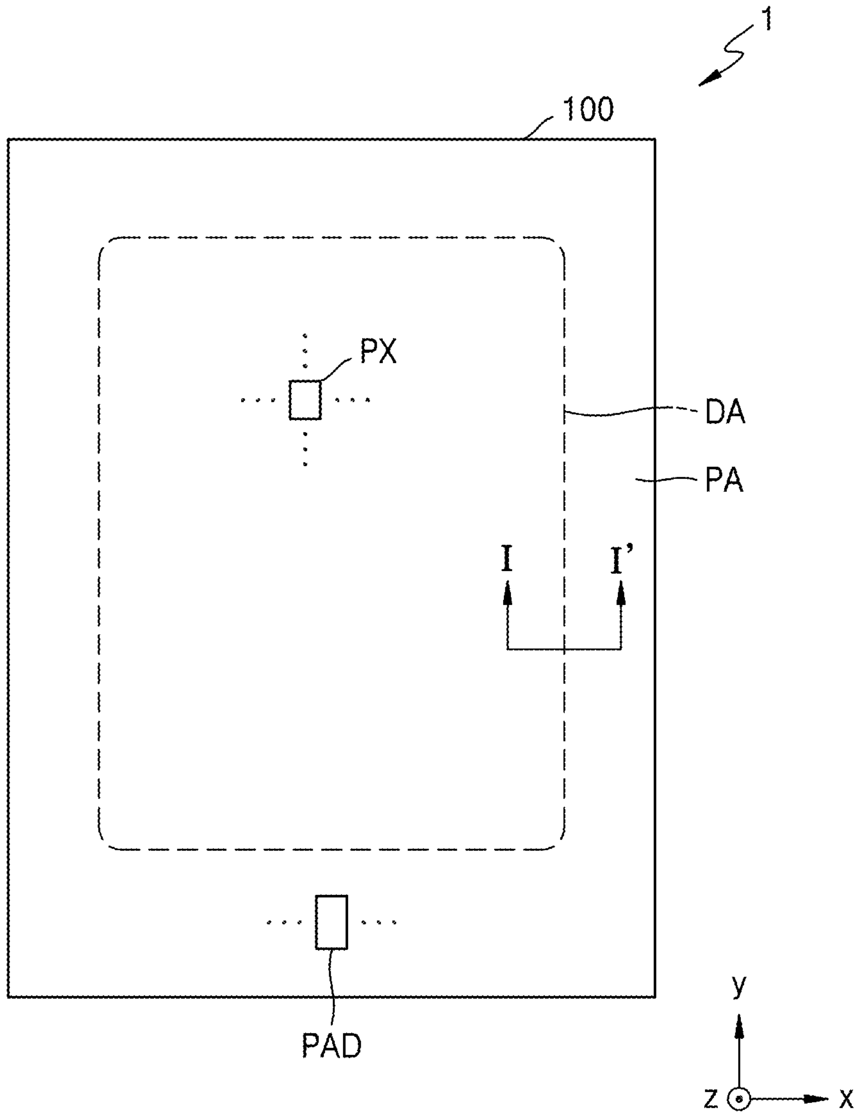
FIG. 1 is a schematic perspective view of an embodiment of a display device.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and embodiments thereof will be illustrated in the drawings and will be described herein in detail. The effects and features of the disclosure and the accompanying methods thereof will become apparent from the following description of the embodiments, taken in conjunction with the accompanying drawings. However, the disclosure is not limited to the embodiments described below, and may be embodied in various modes.

Hereinafter, the disclosure will be described in detail by explaining embodiments of the disclosure with reference to the attached drawings. Like reference numerals in the drawings denote like elements, and redundant explanations are omitted.

In the embodiments below, it will be understood that although the terms "first," "second," etc. may be used herein to describe various elements, these elements should not be limited by these terms. These elements are only used to distinguish one component from another component.

As used herein, the singular forms "a," "an," and "the" are intended to include the plural forms as well, unless the context clearly indicates otherwise.

In the embodiments below, it will be understood that the terms "comprises" and/or "comprising" used herein specify the presence of stated features or elements, but do not preclude the presence or addition of one or more other features or elements.

It will be further understood that a layer, region, or element that is "formed on" another layer, area, or element may be directly or indirectly formed on the other layer, region, or element. That is, for example, intervening layers, regions, or elements may be present therebetween.

Sizes of elements in the drawings may be exaggerated or contracted for convenience of explanation. In other words, because sizes and thicknesses of elements in the drawings are arbitrarily illustrated for convenience of explanation, the following the disclosure is not limited thereto.

When an embodiment may be implemented differently, a process order may be performed differently from the described order. For example, two consecutively described processes may be performed substantially at the same time or performed in an order opposite to the described order.

It will be understood that when a layer, region, or element is also referred to as being "connected," the layer, the region, or the element may be directly connected or may be indirectly connected with intervening layers, regions, or elements therebetween. For example, when a layer, region, or element is also referred to as being "electrically connected to" or "electrically coupled to" another layer, region, or element, it may be directly or indirectly electrically connected or coupled to the other layer, region, or element. That is, for example, intervening layers, regions, or elements may be therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a schematic perspective view of an embodiment of a display device 1.

Referring to FIG. 1, the display device 1 includes a display area DA displaying an image and a peripheral area PA disposed around the display area DA. The display device 1 may provide an image to the outside by light emitted from the display area DA. Because the display device 1 includes a substrate 100, it may be stated that the substrate 100 has the display area DA and the peripheral area PA.

The display device 1 may provide an image through an array of a plurality of pixels PX in the display area DA. Each of the pixels PX may be defined as an emission area in which a light-emitting element driven by a pixel circuit emits light. In other words, an image may be provided by light emitted from the light-emitting element through the pixel PX. In the display area DA, not only light-emitting elements and pixel circuits, but also various signal lines and power supply lines electrically connected to the pixel circuits may be arranged.

The peripheral area PA is an area that does not provide an image, and may entirely or partially surround the display area DA. In the peripheral area PA, various lines for transmitting electrical signals to be applied to the display area DA, and a pad portion PAD to which a printed circuit board or a driver integrated circuit ("IC") chip are attached may be disposed.

When viewed in a direction perpendicular to one surface of the display device 1, the display device 1 may have a substantially quadrangular (e.g., rectangular) shape. In an embodiment, as shown in FIG. 1, the display device 1 may have an overall quadrangular (e.g., rectangular) planar shape including a short side extending in an x direction and a long side extending in a y direction. A corner where the short side in the x direction and the long side in the y direction meet may have a right angle shape or a round shape having a predetermined curvature. However, the planar shape of the display device 1 is not limited to a rectangle, and may have various shapes, such as a polygon such as a triangle, a circle, an ellipse, and an atypical shape.

Although FIG. 1 illustrates a display device 1 including a flat display surface, the disclosure is not limited thereto. In another embodiment, the display device 1 may include a three-dimensional display surface or a curved display surface. When the display device 1 includes a three-dimensional display surface, the display device 1 may include a plurality of display areas indicating different directions, and may include a polygonal columnar display surface, for example. In another embodiment, when the display device 1 includes a curved display surface, the display device 1 may be implemented in various forms, such as a flexible display device, a foldable display device, and a rollable display device.

The display device 1 may be used as a display screen for various products, such as televisions, laptop computers, monitors, billboards, and the Internet of Things ("IoT"), as well as portable electronic devices, such as mobile phones, smart phones, tablet personal computers ("PCs"), mobile communication terminals, electronic notebooks, electronic books, portable multimedia players ("PMPs"), navigation devices, and ultra mobile PCs ("UMPCs"). In addition, the display device 1 in an embodiment may be used for wearable devices, such as smart watches, watch phones, glasses-type displays, and head mounted displays ("HMDs"). In addition, the display device 1 in an embodiment may be used as a center information display ("CID") disposed on an instrument panel of a vehicle and a center fascia or a dashboard of a vehicle, a room mirror display replacing a side mirror of a vehicle, or a display screen placed on the back of a front seat as entertainment for a rear seat of a passenger in a vehicle.

Figure 2:
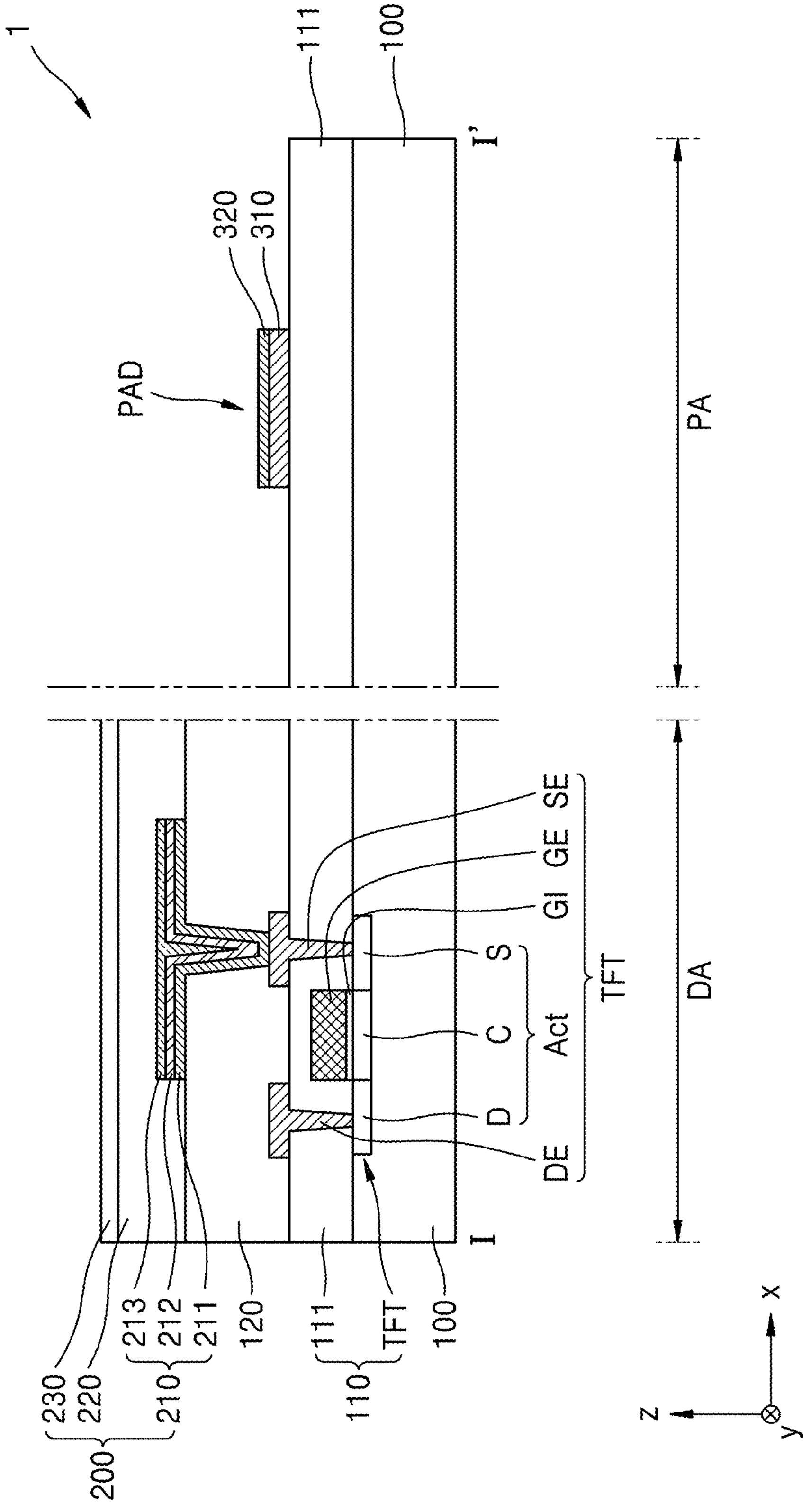
FIG. 2 is a schematic cross-sectional view of an embodiment of a display device.

FIG. 2 is a schematic cross-sectional view of an embodiment of a display device 1. FIG. 2 is a cross-sectional view of the display device 1 taken along line I-I' in FIG. 1.

Referring to FIG. 2, the display device 1 may include a thin-film transistor TFT disposed on a substrate 100 corresponding to a display area DA and a light-emitting element 200 disposed on the thin-film transistor TFT. Also, the display device 1 may include a pad portion PAD disposed on the substrate 100 corresponding to a peripheral area PA.

The substrate 100 may include an upper surface extending in x and y directions. The substrate 100 may include a semiconductor material, e.g., a Group IV semiconductor, a Group III-V compound semiconductor, or a Group II-VI compound semiconductor. The substrate 100 may include a silicon layer. In other words, the substrate 100 may be a semiconductor substrate including a semiconductor material. However, the type of substrate 100 is not limited to a semiconductor substrate. In an embodiment, the substrate 100 may include glass or polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate, for example. In an embodiment, the substrate 100 may have a multi-layered structure including a base layer (not shown) and a barrier layer (not shown), which include the polymer resin described above. Hereinafter, a case in which the substrate 100 includes a semiconductor material is described in detail.

An inter-insulating layer 111 may be disposed on the substrate 100 in the display area DA and the peripheral area PA. The inter-insulating layer 111 may be disposed on the substrate 100 and cover the thin-film transistor TFT in the display area DA. The inter-insulating layer 111 may include at least one of oxide, nitride, and oxynitride. The inter-insulating layer 111 may have a single-layered or multi-layered structure.

In the display area DA, a pixel circuit layer 110 may be disposed on the substrate 100. The pixel circuit layer 110 may include a pixel circuit connected to the light-emitting element 200 and at least one insulating layer. The pixel circuit layer 110 may include at least one thin-film transistor TFT and the inter-insulating layer 111 disposed on the substrate 100.

The thin-film transistor TFT may include a gate dielectric layer GI, a gate electrode GE, and an active region Act. Also, the thin-film transistor TFT may further include a drain electrode DE and a source electrode SE.

The active region Act may be disposed within the substrate 100. The active region Act may be formed as a portion of the substrate 100. The active region Act may be disposed to extend in a first direction, e.g., the x direction, within the substrate 100. A portion of the substrate 100 may be recessed, and the active region Act may be disposed on the recessed portion of the substrate 100. The active region Act may include a channel region C, and a drain region D and a source region S disposed on opposite sides of the channel region C, respectively. In other words, the source region S and the drain region D may be disposed on the substrate 100. Each of the drain region D and the source region S may be a region doped with impurities on the substrate 100 including a semiconductor material. The channel region C may overlap the gate electrode GE.

The gate dielectric layer GI may be disposed between the gate electrode GE and the active region Act. The gate dielectric layer GI may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The gate electrode GE may be disposed on the active region Act. The gate electrode GE may be disposed to cross the active region Act and extend in one direction, e.g., in the y direction. The channel region C of the thin-film transistor TFT may be formed in the active region Act crossing the gate electrode GE. The gate electrode GE may be disposed on the gate dielectric layer GI. The gate electrode GE may include a conductive material. In an embodiment, the gate electrode GE may include a metal nitride, such as titanium nitride (TiN), tantalum nitride (TaN), or tungsten nitride (WN), and/or a metal material, such as aluminum (Al), tungsten (W), copper (Cu), or molybdenum (Mo), or a semiconductor material, such as doped polysilicon. The gate electrode GE may include multiple layers or a single layer including the material described above.

The drain electrode DE and the source electrode SE may be disposed on the inter-insulating layer 111. The drain electrode DE and the source electrode SE may be connected to the drain region D and the source region S of the active region Act through contact holes provided in the inter-insulating layer 111, respectively. The drain electrode DE may be electrically connected to the drain region D, and the source electrode SE may be electrically connected to the source region S. The drain electrode DE and the source electrode SE may include a material having substantially good conductivity. The drain electrode DE and the source electrode SE may include a conductive material including, e.g., Mo, Al, Cu, or Ti, and may include multiple layers or a single layer including the aforementioned conductive material.

A via-insulating layer 120 may be disposed on the pixel circuit layer 110. The light-emitting element 200 may be electrically connected to the thin-film transistor TFT through a contact hole defined in the via-insulating layer 120. The pixel electrode 210 of the light-emitting element 200 may be electrically connected to the thin-film transistor TFT through a contact hole defined in the via-insulating layer 120.

The light-emitting element 200 may be disposed on the via-insulating layer 120. The light-emitting element 200 may have a stacked structure including a pixel electrode 210, an emission layer 220, and an opposite electrode 230. In an embodiment, the light-emitting element 200 may emit white light, but is not limited thereto. In an embodiment, the light-emitting element 200 may emit red, green, or blue light or emit red, green, blue, or white light, for example. Light emitted from the light-emitting element 200 may pass through a plurality of color filters (not shown) and be emitted as red light, green light, and blue light, respectively. The color filters may be disposed in an area overlapping the light-emitting element 200 in a direction perpendicular to the upper surface of the substrate 100.

The light-emitting element 200 of the display device 1 may include an organic light-emitting diode ("OLED"), but is not limited thereto. In another embodiment, the display device 1 may be a light-emitting display including an inorganic light-emitting diode, that is, an inorganic light-emitting display. In another embodiment, the display device 1 may be a quantum dot light-emitting display.

The pixel electrode 210 may include a lower layer 211, an intermediate layer 212 disposed on the lower layer 211, and an upper layer 213 disposed on the intermediate layer 212. The pixel electrode 210 may include a material that is easily dry-etched to form a fine pattern. The pixel electrode 210 may be disposed on the via-insulating layer 120. The pixel electrode 210 may be disposed on the pixel circuit layer 110 and electrically connected to the thin-film transistor TFT. The pixel electrode 210 is illustrated as being connected to the source electrode SE, but is not limited thereto and may be connected to the drain electrode DE in other embodiments.

The lower layer 211 may be disposed on the via-insulating layer 120. The lower layer 211 may contact the source electrode SE or the drain electrode DE. The lower layer 211 may be apart from the upper layer 213 with the intermediate layer 212 therebetween. The lower layer 211 may be disposed at the lowermost portion of the pixel electrode 210.

The lower layer 211 may include a conductive material that is easily dry-etched. The lower layer 211 may include a conductive material having excellent contact resistance characteristics, e.g., a contact resistance of 1 ohm (Ω) or less. The lower layer 211 may include titanium nitride (TiN), for example. The lower layer 211 may include the same material as a second pad electrode layer 320 of the pad portion PAD. As described with reference to FIGS. 8 to 10, the lower layer 211 is formed by the same process step as the second pad electrode layer 320, and thus, may be a layer including the same material as that of the second pad electrode layer 320. Titanium nitride (TiN) may improve contact resistance by preventing the formation of an oxide film on the surface of a contacting conductive layer.

The intermediate layer 212 may be a reflective layer that reflects light. The intermediate layer 212 may be disposed on the lower layer 211. The intermediate layer 212 may be disposed between the lower layer 211 and the upper layer 213.

The intermediate layer 212 may include a material that is easily dry-etched and has relatively high surface flatness. The intermediate layer 212 may include an aluminum alloy, for example. The intermediate layer 212 may include an aluminum-nickel-lanthanum alloy (Al—Ni—La alloy) or an aluminum-titanium alloy (Al—Ti alloy), for example. In the Al—Ni—La alloy, the sum of the atomic ratio of Ni and the atomic ratio of La may be in a range of 0.01 at % or more and less than 0.1 at %. In the Al—Ti alloy, the atomic ratio of Ti may be in a range of 0.01 at % or more and less than 0.1 at %. As shown in (a) of FIG. 5, an Al—Ni—La alloy, in which the sum of the atomic ratio of Ni and the atomic ratio of La is in the range of 0.01 at % or more, may prevent or reduce the occurrence of hillock defects in a subsequent heat treatment process. As shown in (b) of FIG. 5, an Al—Ti alloy, in which the atomic ratio of Ti is in the range of 0.01 at % or more, may prevent or reduce the occurrence of hillock defects in a subsequent heat treatment process. When the sum of the atomic ratio of Ni and the atomic ratio of La in the Al—Ni—La alloy is less than 0.1 at % and when the atomic ratio of Ti in the Al—Ti alloy is less than 0.1 at %, the Al—Ni—La alloy and the Al—Ti alloy have relatively high reflectance characteristics, similar to pure aluminum. Therefore, when the sum of the atomic ratio of Ni and the atomic ratio of La in the Al—Ni—La alloy is 0.1 at % or more and when the atomic ratio of Ti in the Al—Ti alloy is 0.1 at % or more, it may be difficult for the intermediate layer 212 to function as a reflective layer.

The upper layer 213 may be disposed on the intermediate layer 212. The upper layer 213 may be disposed in an uppermost portion of the pixel electrode 210. The upper layer 213 may be a hole injection layer. The upper layer 213 may include titanium oxide ($TiO_x$). Titanium oxide ($TiO_x$) has a work function value of about 5.8 electronvolts (eV)

and may function as a hole injection layer. The thickness of the upper layer 213 may range from about 20 angstroms (Å) to about 50 Å. When the thickness of the upper layer 213 exceeds about 50 Å, electrical characteristics of the pixel electrode 210 may deteriorate due to increased resistance, and when the thickness of the upper layer 213 is less than about 20 Å, a hole injection function thereof may deteriorate.

The pad portion PAD may be disposed on the peripheral area PA of the substrate 100. The pad portion PAD may be disposed on the inter-insulating layer 111 in the peripheral area PA. The pad portion PAD may include a first pad electrode layer 310 and a second pad electrode layer 320 disposed on the first pad electrode layer 310. At least a portion of the pad portion PAD may include the same material as that of the lower layer 211 of the pixel electrode 210. At least some layers of the pad portion PAD may include TiN.

Figure 6:
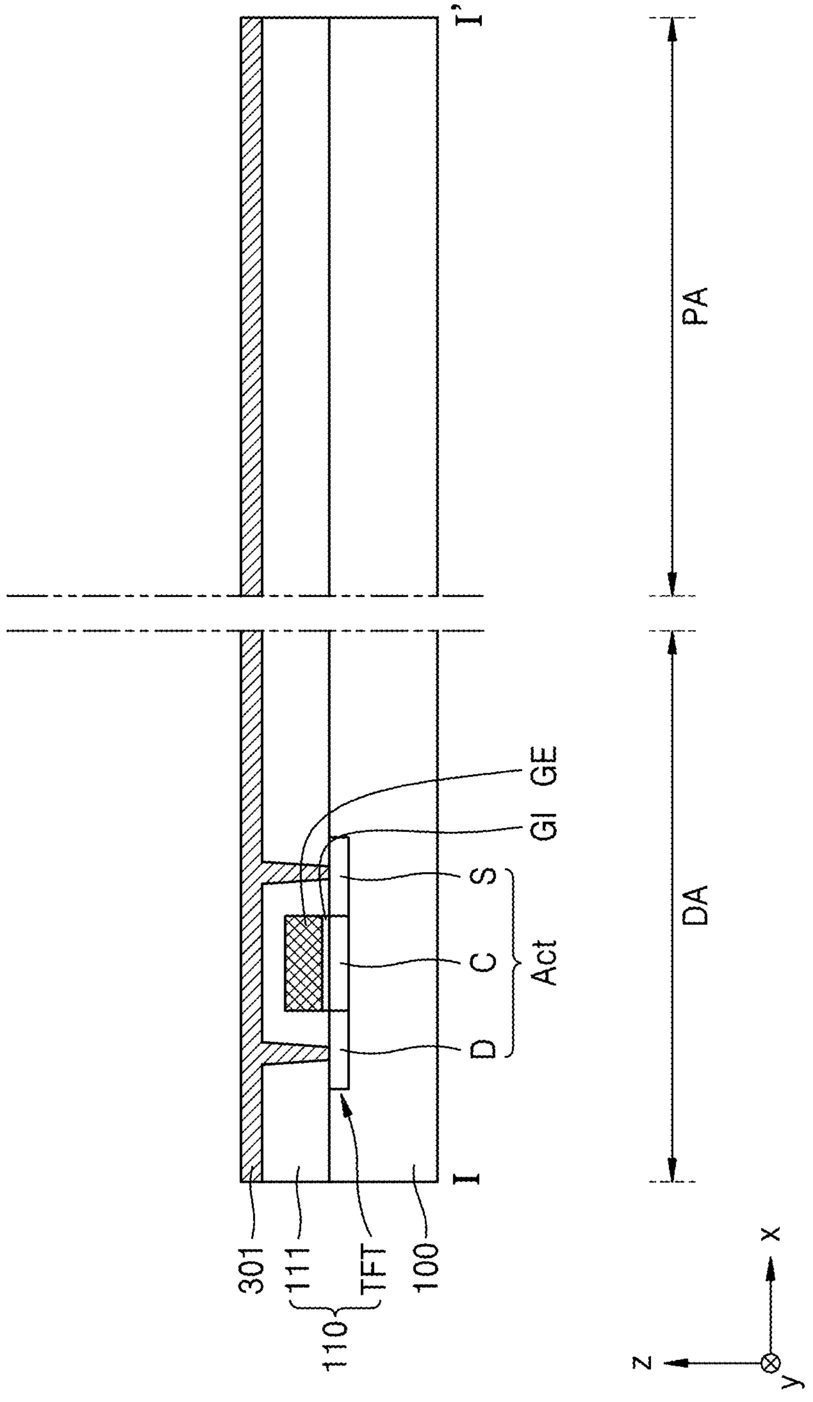
FIGS. 6 to 10 are schematic cross-sectional views illustrating an embodiment of a method of manufacturing a display device.
Figure 7:
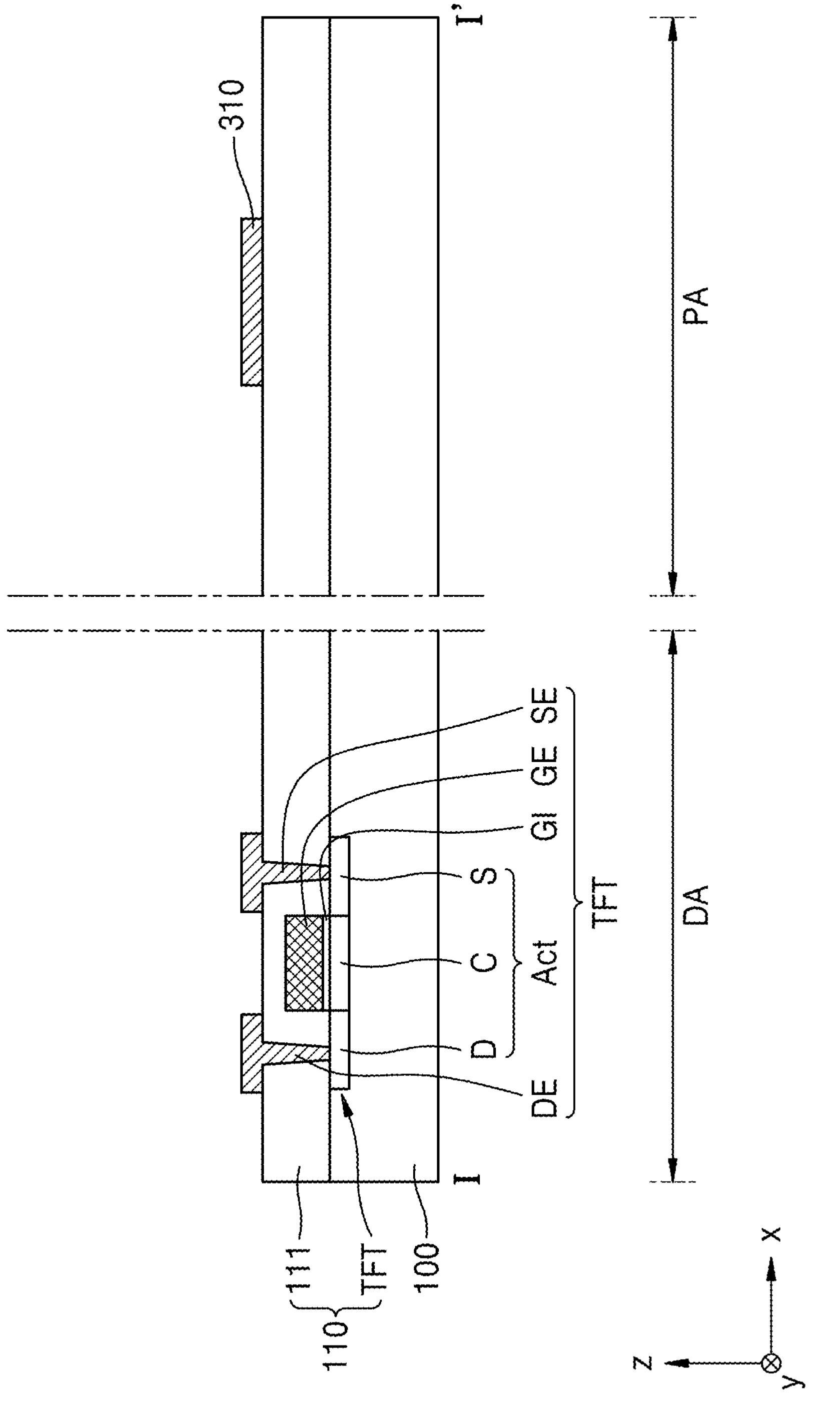

The first pad electrode layer 310 may be disposed on the inter-insulating layer 111. The first pad electrode layer 310 may be disposed between the inter-insulating layer 111 and the second pad electrode layer 320. An upper surface of the first pad electrode layer 310 may not be exposed by the second pad electrode layer 320. The first pad electrode layer 310 may include the same material as that of the source electrode SE and the drain electrode DE. As shown in FIGS. 6 and 7, the first pad electrode layer 310 is formed in the same process step as the source electrode SE and the drain electrode DE and may thus include the same conductive material as the source electrode SE and the drain electrode DE. The first pad electrode layer 310 may include a material having substantially good conductivity. The first pad electrode layer 310 may include a conductive material including, e.g., Mo, Al, Cu, or Ti, and may include multiple layers or a single layer including the aforementioned conductive material.

The second pad electrode layer 320 may be disposed in an uppermost portion of the pad portion PAD. The second pad electrode layer 320 may be disposed on the first pad electrode layer 310 and contact the first pad electrode layer 310. The second pad electrode layer 320 may cover an upper surface of the first pad electrode layer 310. The second pad electrode layer 320 may be a layer that prevents oxidation of the first pad electrode layer 310. The second pad electrode layer 320 may include the same material as that of the lower layer 211. In an embodiment, the second pad electrode layer 320 may include TiN. The second pad electrode layer 320 may prevent oxidation of the surface of the first pad electrode layer 310 to improve contact resistance of the pad portion PAD, thereby increasing the electrical reliability of the display device 1.

Figure 3:
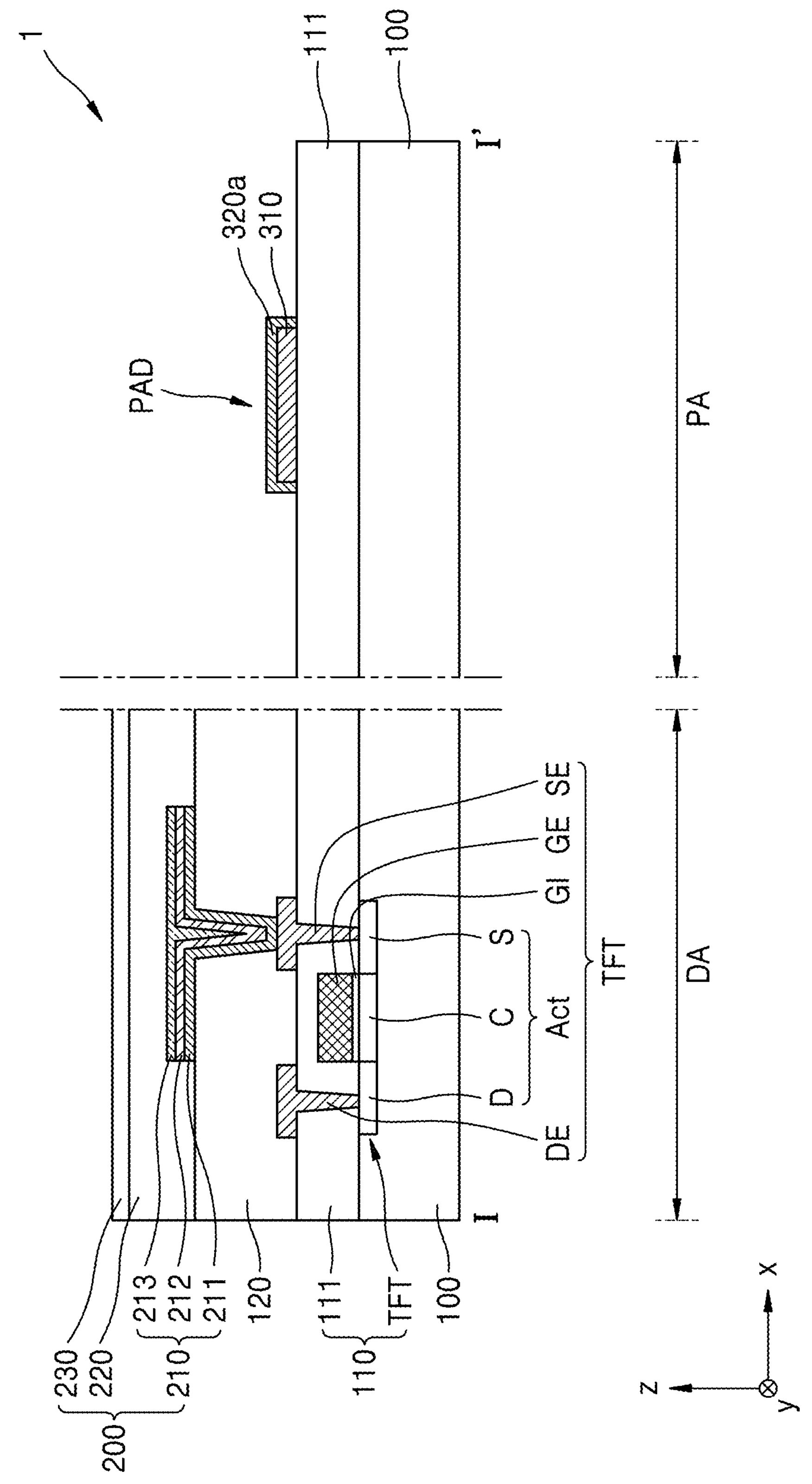
FIG. 3 is a schematic cross-sectional view of a modified embodiment of a display device.

FIG. 3 is a schematic cross-sectional view of a modified embodiment a display device. FIG. 3 is a cross-sectional view of a modified embodiment of the display device 1, taken along line I-I' in FIG. 1. In FIG. 3, the same reference numerals as those in FIG. 2 denote the same members as those in FIG. 2, and thus, redundant descriptions thereof are omitted and only changed parts are described.

Referring to FIG. 3, the pad portion PAD may include a first pad electrode layer 310 and a second pad electrode layer 320*a* disposed on the first pad electrode layer 310 and covering the first pad electrode layer 310.

The pad portion PAD may be disposed on the peripheral area PA of the substrate 100. The pad portion PAD may be disposed on the inter-insulating layer 111 in the peripheral area PA. As described above, the pad portion PAD may include the first pad electrode layer 310 and the second pad electrode layer 320*a* disposed on the first pad electrode layer 310. At least a portion of the pad portion PAD may include the same material as that of the lower layer 211 of the pixel electrode 210. At least some layers of the pad portion PAD may include TiN.

The first pad electrode layer 310 may be disposed on the inter-insulating layer 111. The first pad electrode layer 310 may be disposed between the inter-insulating layer 111 and the second pad electrode layer 320*a*. A surface of the first pad electrode layer 310 may be surrounded by the second pad electrode layer 320*a*. The first pad electrode layer 310 may not be exposed to the outside by the second pad electrode layer 320*a*. An upper surface of the first pad electrode layer 310 may not be exposed to the outside by the second pad electrode layer 320*a*. A side surface of the first pad electrode layer 310 may not be exposed to the outside by the second pad electrode layer 320*a*.

The first pad electrode layer 310 may include the same material as that of the source electrode SE and the drain electrode DE. The first pad electrode layer 310 may include a material having substantially good conductivity. The first pad electrode layer 310 may include a conductive material including, e.g., Mo, Al, Cu, or Ti, and may include multiple layers or a single layer including the aforementioned conductive material.

In an embodiment, the second pad electrode layer 320*a* may cover the side surface and top surface of the first pad electrode layer 310. The second pad electrode layer 320*a* may be disposed in an uppermost portion of the pad portion PAD. The second pad electrode layer 320*a* may be disposed on the first pad electrode layer 310 and may contact the first pad electrode layer 310. The second pad electrode layer 320*a* may be a layer that prevents oxidation of the first pad electrode layer 310. The second pad electrode layer 320*a* may include the same material as that of the lower layer 211. In an embodiment, the second pad electrode layer 320*a* may include TiN, for example. The second pad electrode layer 320*a* may prevent oxidation of the surface of the first pad electrode layer 310 to improve contact resistance of the pad portion PAD, thereby increasing the electrical reliability of the display device 1.

Figure 4:
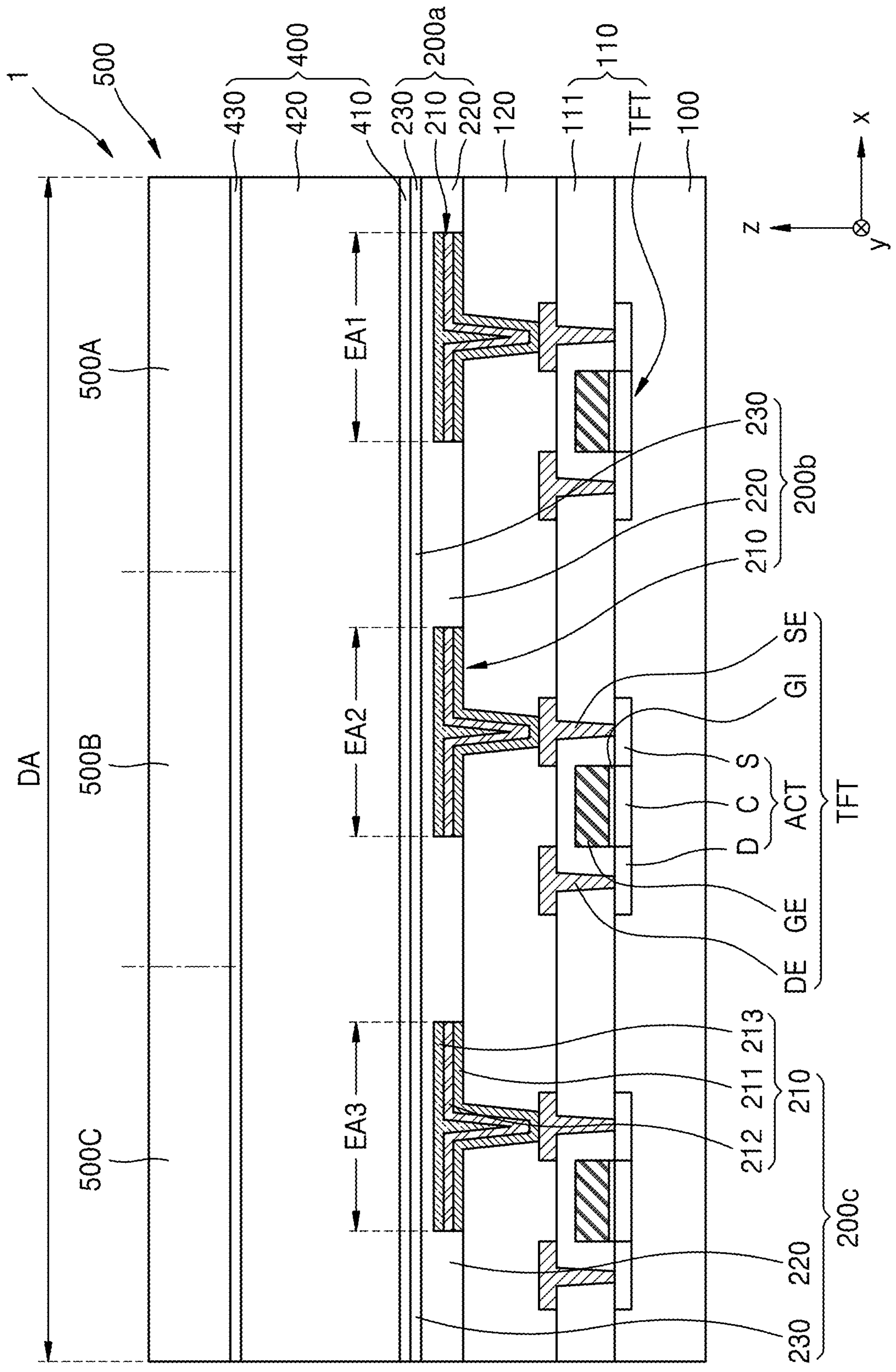
FIG. 4 is a schematic cross-sectional view of an embodiment of a display device.

FIG. 4 is a schematic cross-sectional view of an embodiment of a display device 1 in a display area DA. In FIG. 4, the same reference numerals as those in FIG. 2 denote the same members as those in FIG. 2, and thus, redundant descriptions thereof are omitted.

Referring to FIG. 4, in the display area DA, the display device 1 may further include a plurality of light-emitting elements 200*a*, 200*b*, and 200*c*, a thin-film encapsulation layer disposed on the plurality of light-emitting elements 200*a*, 200*b*, and 200*c*, and a color filter layer 500 disposed on the thin-film encapsulation layer 400.

As the display device 1 includes the plurality of light-emitting elements 200*a*, 200*b*, and 200*c* and the plurality of light-emitting elements 200*a*, 200*b*, and 200*c* emits light through emission areas EA1, EA2, and EA3, respectively, the display device 1 may provide an image. The plurality of light-emitting elements 200*a*, 200*b*, and 200*c* may be disposed on a via-insulating layer 120. Each of the plurality of light-emitting elements 200*a*, 200*b*, and 200*c* may have a stacked structure including a pixel electrode 210, an emission layer 220, and an opposite electrode 230.

The plurality of light-emitting elements 200*a*, 200*b*, and 200*c* may include a first light-emitting element 200*a*, a second light-emitting element 200*b*, and a third light-emitting element 200*c*. In an embodiment, the plurality of light-emitting elements 200*a*, 200*b*, and 200*c* may emit white light. In another embodiment, each of the plurality of light-emitting elements 200_a_, 200_b_, and 200_c_ may emit red, green, or blue light or emit red, green, blue, or white light, for example. The plurality of light-emitting elements 200_a_, 200_b_, and 200_c_ emits light, and light-emitting areas may be defined as first to third emission areas EA1, EA2, and EA3, respectively.

In an embodiment, the emission layer 220 may be unitary to cover an entirety of the substrate 100, but is not limited thereto. In another embodiment, the emission layer 220 may include a plurality of layers apart from each other to correspond to the plurality of pixel electrodes 210, respectively.

The thin-film encapsulation layer 400 may be disposed on the opposite electrode 230. The thin-film encapsulation layer 400 may cover the light-emitting elements 200_a_, 200_b_, and 200_c_. The thin-film encapsulation layer 400 may include at least one inorganic encapsulation layer and at least one organic encapsulation layer. In an embodiment, the thin-film encapsulation layer 400 may include a first inorganic encapsulation layer 410, an organic encapsulation layer 420 on the first inorganic encapsulation layer 410, and a second inorganic encapsulation layer 430.

The first inorganic encapsulation layer 410 and the second inorganic encapsulation layer 430 may include one or more inorganic materials selected from among aluminum oxide, titanium oxide, tantalum oxide, hafnium oxide, zinc oxide, silicon oxide, silicon nitride, and silicon oxynitride. The organic encapsulation layer 420 may include a polymer-based material. In embodiments, the polymer-based material may include acrylic resin, epoxy resin, polyimide, or polyethylene. In an embodiment, the organic encapsulation layer 420 may include acrylate. The organic encapsulation layer 420 may be formed by curing a monomer or applying a polymer. The organic encapsulation layer 420 may have transparency.

The color filter layer 500 may be disposed on the thin-film encapsulation layer 400. The color filter layer 500 may include a first color filter 500A, a second color filter 500B, and a third color filter 5000. The first to third color filters 500A, 500B, and 5000 may be disposed to respectively correspond to each of the pixel electrodes 210 of the plurality of light-emitting elements 200_a_, 200_b_, and 200_c_. In an embodiment, the first color filter 500A may be disposed to overlap the pixel electrode 210 of the first light-emitting element 200_a_ in a direction perpendicular to the substrate 100, e.g., in the z direction. In an embodiment, the second color filter 500B may be disposed to overlap the pixel electrode 210 of the second light-emitting element 200_b_ in the direction perpendicular to the substrate 100, e.g., in the z direction, for example. In an embodiment, the third color filter 5000 may be disposed to overlap the pixel electrode 210 of the third light-emitting element 200_c_ in the direction perpendicular to the substrate 100, e.g., in the z direction, for example.

Each of the first to third color filters 500A, 500B, and 5000 may include a photosensitive resin. Each of the first to third color filters 500A, 500B, and 5000 may include a pigment or dye exhibiting a unique color.

Each of the first to third color filters 500A, 500B, and 5000 may transmit red, green, or blue light. In an embodiment, the first color filter 500A may be a red color filter that selectively transmits red light of light emitted from the emission layer 220, for example. In an embodiment, the first color filter 500A may pass only light having a wavelength ranging from about 630 nanometers (nm) to about 780 nm, for example. In an embodiment, the second color filter 500B may be a green color filter that selectively transmits green light of light emitted from the emission layer 220, for example. In an embodiment, the second color filter 500B may pass only light having a wavelength ranging from about 495 nm to about 570 nm, for example. In an embodiment, the third color filter 5000 may be a blue color filter that selectively transmits blue light of light emitted from the emission layer 220, for example. In an embodiment, the third color filter 5000 may transmit only light having a wavelength ranging from about 450 nm to about 495 nm.

Figure 5:
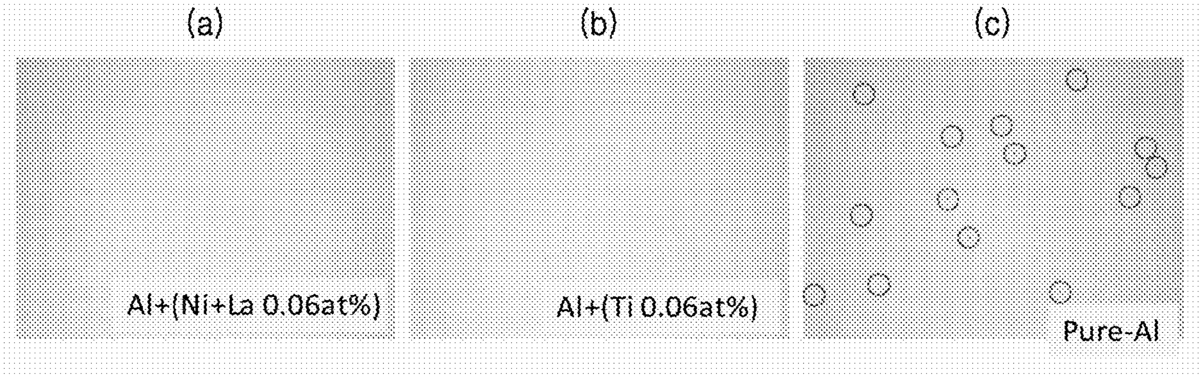
FIG. 5 is a photograph obtained by observing, by a microscope, the surface of an intermediate layer including or consisting of an aluminum alloy and aluminum.

FIG. 5 is a photograph obtained by observing, by a microscope, the surface of an intermediate layer including or consisting of an aluminum alloy and aluminum. Specifically, FIG. 5 is a photograph obtained by performing a heat treatment process at about 250° C. on the surface of the intermediate layer 212 of the pixel electrode 210 in FIG. 2, including or consisting of an aluminum alloy and aluminum, and then observing the surface of the intermediate layer 212 at a magnification of 50.

(a) of FIG. 5 shows the surface of an intermediate layer including an Al—Ni—La alloy in which the sum of the atomic ratio of Ni and the atomic ratio of La is 0.06 at %. (b) of FIG. 5 shows the surface of an intermediate layer including an Al—Ti alloy in which the atomic ratio of Ti is 0.06 at %. (c) of FIG. 5 shows the surface of an intermediate layer including pure Al.

Referring to FIG. 5, it may be seen that, unlike in embodiments (a) and (b) including an aluminum alloy, a hillock defect that occurs in the case of a comparative example (c) including pure Al. In other words, in the case of using an Al—Ni—La alloy including Ni and La or an Al—Ti alloy including Ti rather than in the case of using pure Al, hillock defects may be reduced or prevented.

FIGS. 6 to 10 are schematic cross-sectional views illustrating an embodiment of a method of manufacturing a display device. FIGS. 6 to 10 are schematic cross-sectional views illustrating a method of manufacturing a display device, the cross-sectional views corresponding to that of FIG. 2.

Referring to FIG. 6, a substrate 100, a pixel circuit layer 110 including a thin-film transistor TFT, and a preliminary electrode layer 301 on the pixel circuit layer 110 may be formed.

The substrate 100 may include a Group IV semiconductor, a Group III-V compound semiconductor, or a Group II-VI compound semiconductor. The substrate 100 may include a silicon layer, for example. The substrate 100 may include a display area DA and a peripheral area PA surrounding the display area DA.

A gate dielectric layer GI and a gate electrode GE may be sequentially formed on the substrate 100. The gate dielectric layer GI and the gate electrode GE may be formed using atomic layer deposition ("ALD") or chemical vapor deposition ("CVD").

In an embodiment, the gate dielectric layer GI may include an inorganic insulating material, such as $SiO_2$, $SiN_x$, SiON, $Al_2O_3$, $TiO_2$, $Ta_2O_5$, $HfO_2$, or $ZnO_2$, for example. In an embodiment, the gate electrode GE may include a metal nitride, such as TiN, TaN, or WN, and/or a metal material, such as Al, W, Cu, or Mo, or a semiconductor material, such as doped polysilicon, for example.

Next, an ion implantation process may be performed to form a drain region D and a source region S. Next, an inter-insulating layer 111 may be formed on the substrate 100 to cover the gate dielectric layer GI and the gate electrode GE. The inter-insulating layer 111 may be formed on the display area DA and the peripheral area PA of the substrate 100.

Next, a portion of the inter-insulating layer 111 may be removed to form a contact hole connected to each of the drain region D and the source region S, and then the preliminary electrode layer 301 may be formed on the inter-insulating layer 111. The preliminary electrode layer 301 may include a conductive material. In an embodiment, the preliminary electrode layer 301 may include a conductive material including, e.g., Mo, Al, Cu, or Ti, and may include multiple layers or a single layer including the aforementioned conductive material, for example.

Referring to FIG. 7, the preliminary electrode layer 301 may be patterned to form the source electrode SE and the drain electrode DE on the display area DA of the substrate 100, and a first pad electrode layer 310 may be formed on the peripheral area PA of the substrate 100. The source electrode SE, the drain electrode DE, and the first pad electrode layer 310 are formed by the same process and thus may include the same material.

Figure 8:
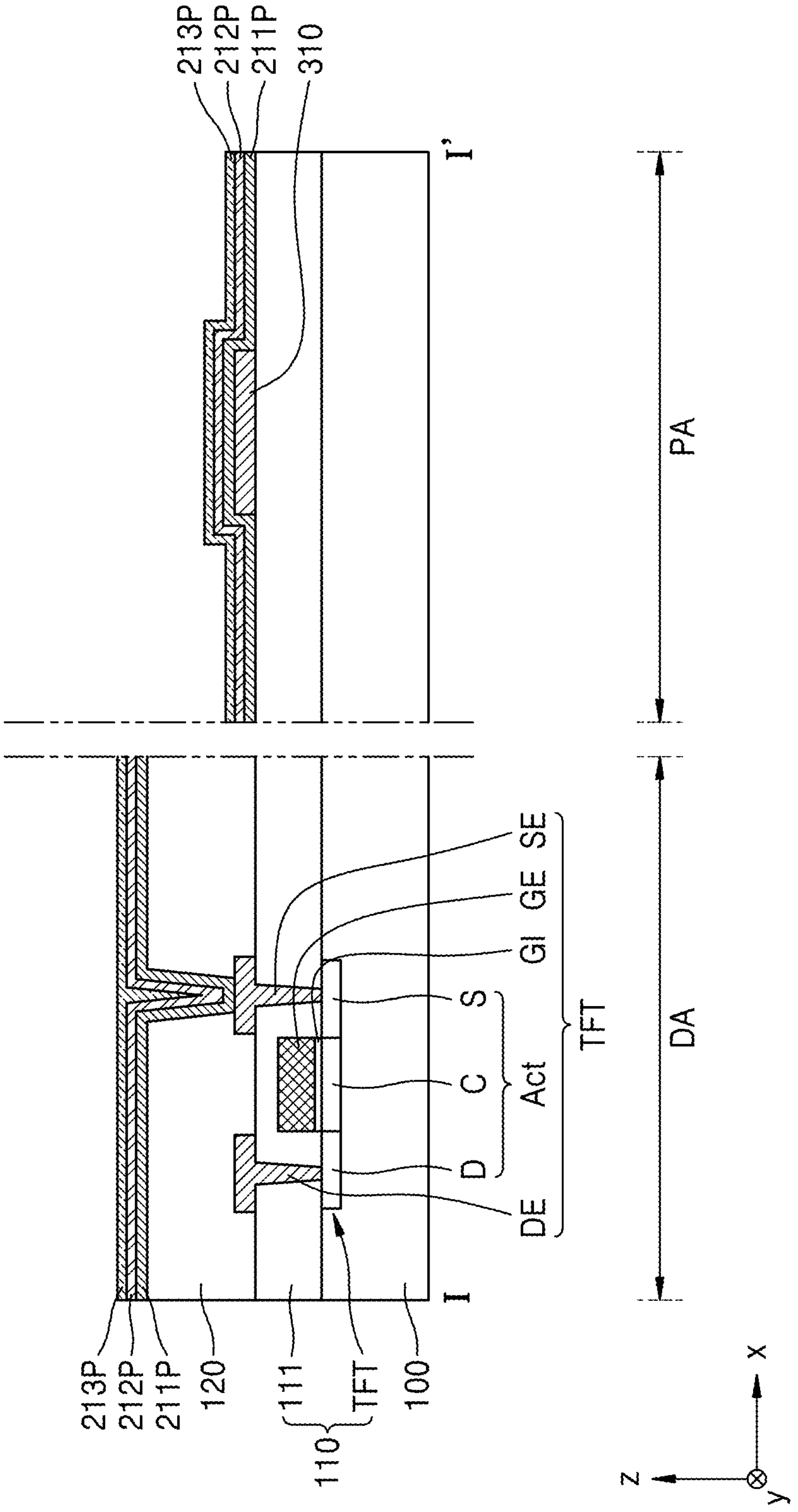

Referring to FIG. 8, a via-insulating layer 120 may be formed on the inter-insulating layer 111 in the display area DA and cover the thin-film transistor TFT. Next, a contact hole connected to the source electrode SE or the drain electrode DE may be defined in the via-insulating layer 120. Next, a lower conductive layer 211P, an intermediate conductive layer 212P, and an upper conductive layer 213P may be sequentially formed in the display area DA and the peripheral area PA.

The lower conductive layer 211P may be formed on the via-insulating layer 120 in the display area DA and formed on the inter-insulating layer 111 to cover the first pad electrode layer 310 in the peripheral area PA. In other words, the lower conductive layer 211P may be formed on an entirety of the display area DA and the peripheral area PA and disposed on the thin-film transistor TFT and the first pad electrode layer 310. The lower conductive layer 211P may be formed to be electrically connected to the thin-film transistor TFT in the display area DA. The lower conductive layer 211P may include a conductive material that is easily dry-etched. The lower conductive layer 211P may include TiN.

The intermediate conductive layer 212P may be formed on the lower conductive layer 211P. The intermediate conductive layer 212P may be formed on an entirety of the display area DA and the peripheral area PA.

The intermediate conductive layer 212P may include a material that is easily dry-etched and has relatively high surface flatness. The intermediate conductive layer 212P may include an aluminum alloy, for example. The intermediate conductive layer 212P may include an Al—Ni—La alloy or an Al—Ti alloy, for example. In the Al—Ni—La alloy included in the intermediate conductive layer 212P, the sum of the atomic ratio of Ni and the atomic ratio of La may be in a range of 0.01 at % or more and less than 0.1 at %. In the Al—Ti alloy included in the intermediate conductive layer 212P, the atomic ratio of Ti may be in a range of 0.01 at % or more and less than 0.1 at %. When the intermediate conductive layer 212P includes an aluminum alloy, the occurrence of a hillock defect in a subsequent heat treatment process may be prevented or reduced.

The upper conductive layer 213P may be formed on the intermediate conductive layer 212P. The upper conductive layer 213P may be formed on an entirety of the display area DA and the peripheral area PA. The upper conductive layer 213P may include titanium oxide ($TiO_x$). The upper conductive layer 213P may include a conductive material having a work function value of about 5.8 eV. The thickness of the upper conductive layer 213P in a thickness direction (e.g., z direction) may be in a range of about 20 Å to about 50 Å.

Each of the lower conductive layer 211P, the intermediate conductive layer 212P, and the upper conductive layer 213P may be formed by a deposition method, such as CVD, plasma enhanced CVD ("PECVD"), low pressure CVD ("LPCVD"), physical vapor deposition ("PVD"), sputtering, or ALD.

Figure 9:
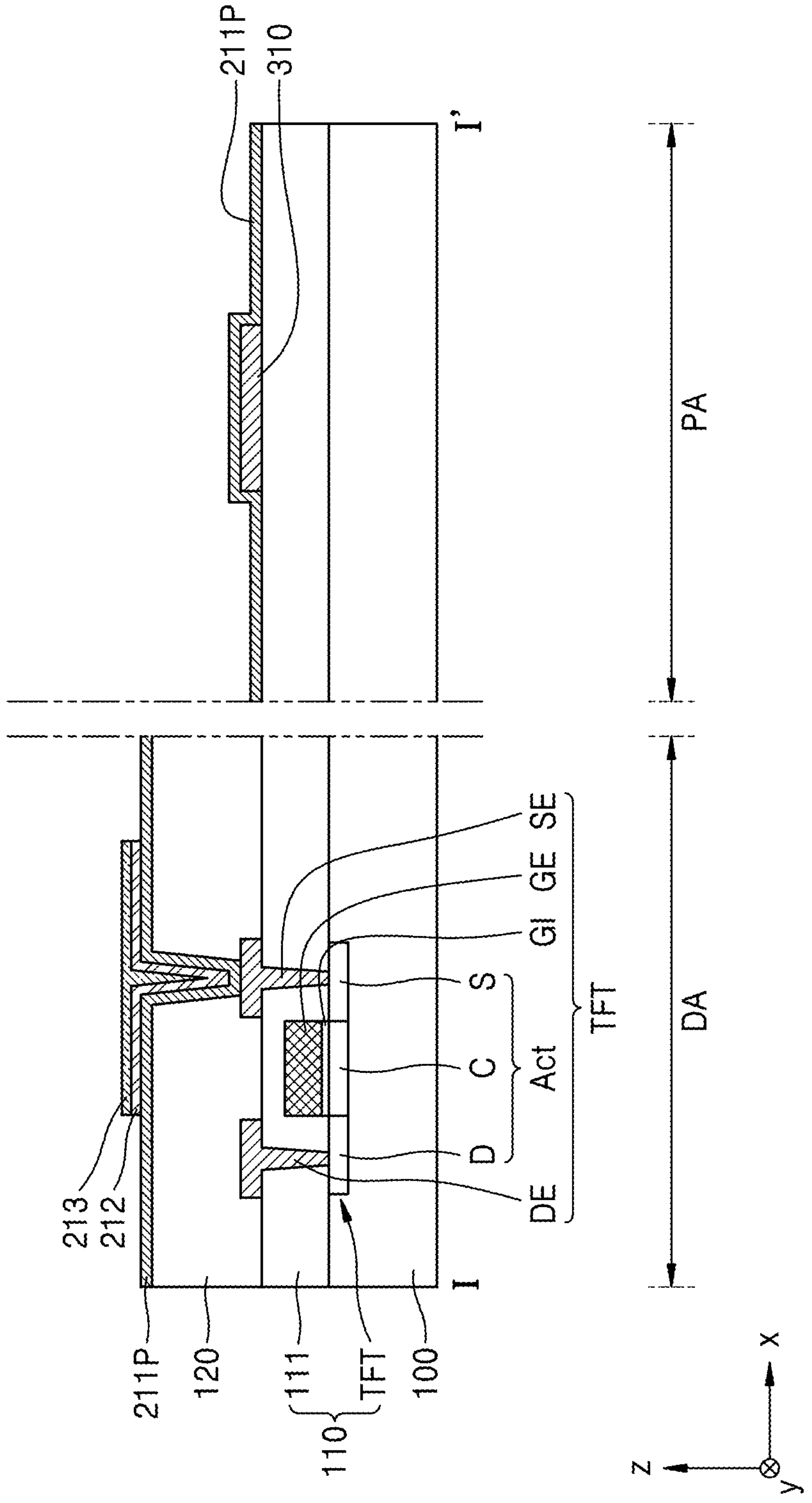
Figure 10:
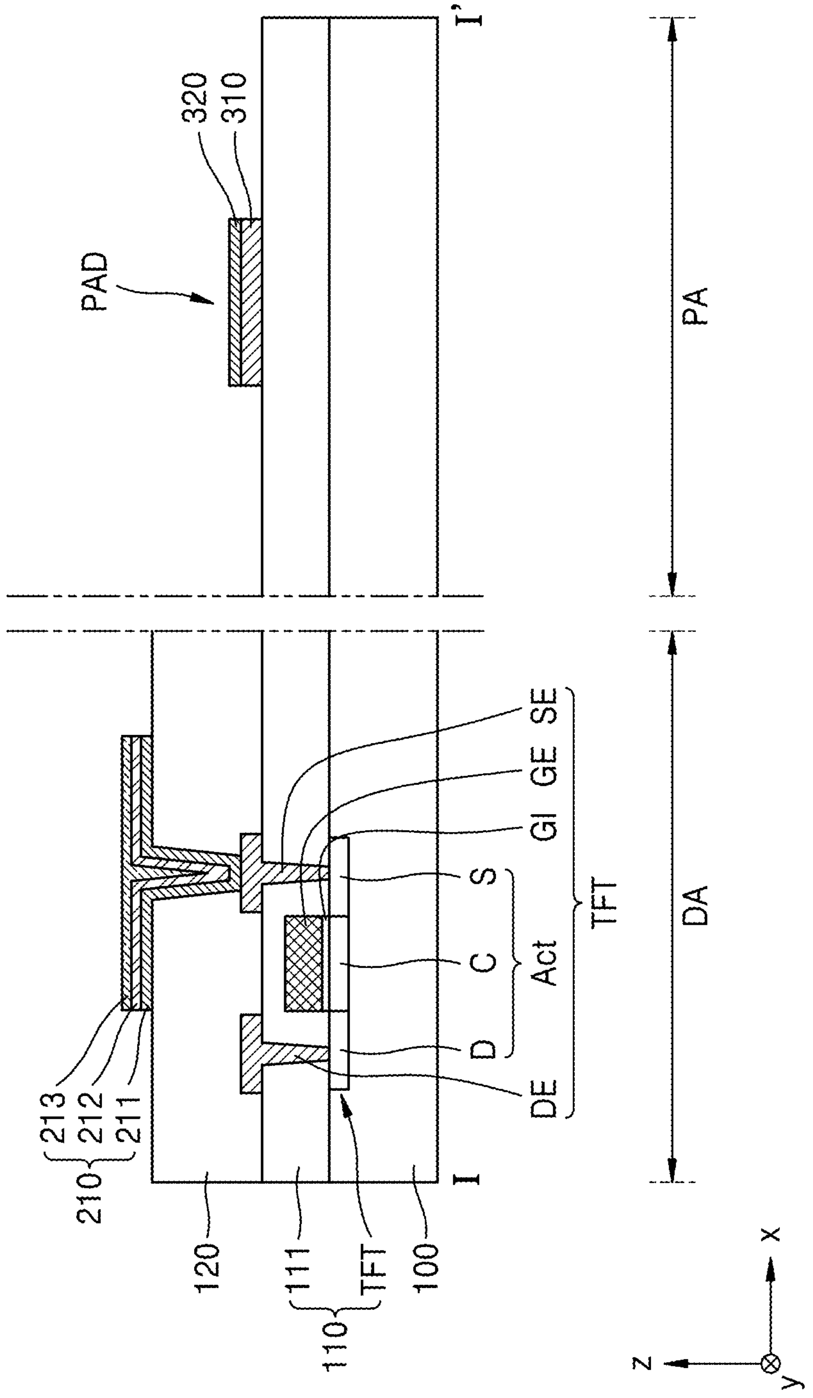

Referring to FIGS. 9 and 10, a pixel electrode 210 may be formed in the display area DA by removing portions of the lower conductive layer 211P, the intermediate conductive layer 212P, and the upper conductive layer 213P, and a pad portion PAD may be formed in the peripheral area PA. Because portions of the lower conductive layer 211P, the intermediate conductive layer 212P, and the upper conductive layer 213P are removed by dry etching, it is possible to easily form a fine pattern.

Referring to FIG. 9, the intermediate layer 212 and the upper layer 213, which constitute the pixel electrode 210, may be formed by removing portions of the upper conductive layer 213P and the intermediate conductive layer 212P. The upper conductive layer 213P and the intermediate conductive layer 212P may be entirely removed from the peripheral area PA and partially removed from the display area DA. The portions of the upper conductive layer 213P and the intermediate conductive layer 212P may be removed by a dry etching process. The dry etching process of removing the portions of the upper conductive layer 213P and the intermediate conductive layer 212P may be performed using a chlorine-based process gas, for example.

Referring to FIG. 10, after the intermediate layer 212 and the upper layer 213 constituting the pixel electrode 210 are formed, a portion of the lower conductive layer 211P may be removed to form a lower layer 211 of the pixel electrode 210 and a second pad electrode layer 320. The lower layer 211 may be formed by removing a portion of the lower conductive layer 211P in the display area DA. The second pad electrode layer 320 may be formed by removing a portion of the lower conductive layer 211P in the peripheral area PA. A portion of the lower conductive layer 211P may be removed by a dry etching process. The process of etching the lower conductive layer 211P may be performed after the process of etching the upper conductive layer 213P and the intermediate conductive layer 212P is performed and then the etching is stopped in the lower conductive layer 211P. The dry etching process of removing the lower conductive layer 211P may be performed using a chlorine-based process gas, for example.

Next, referring back to FIG. 2, the emission layer 220 may be formed on the via-insulating layer 120 to cover the pixel electrode 210 and the opposite electrode 230 may be formed on the emission layer 220, and thus, the light-emitting element 200 may be formed. In an embodiment, the emission layer 220 may include an organic material including a fluorescent or phosphorescent material that emits white light. In another embodiment, the emission layer 220 may include an organic material including a fluorescent or phosphorescent material that emits red, green, blue, or white light. The emission layer 220 may include a relatively low molecular weight organic material or a relatively high molecular weight organic material, and below and above the organic emission layer, functional layers, such as a hole transport layer ("HTL"), a hole injection layer ("HIL"), an electron transport layer ("ETL"), and an electron injection layer ("EIL"), may be selectively further disposed. The emission layer 220 may be formed as an integral layer across the plurality of pixel electrodes 210, but is not limited thereto. In an embodiment, emission layers 220 may be apart from each other to correspond to the plurality of pixel electrodes 210, respectively.

The opposite electrode 230 may be formed by a deposition method, such as CVD, PECVD, LPCVD, PVD, sputtering, or ALD.

It should be understood that embodiments described herein should be considered in a descriptive sense only and not for purposes of limitation. Descriptions of features or features within each embodiment should typically be considered as available for other similar features in other embodiments. While embodiments have been described with reference to the drawing figures, it will be understood by those of ordinary skill in the art that various changes in form and details may be made therein without departing from the spirit and scope as defined by the following claims.

What is claimed is:

1. A display device comprising:

a substrate including a display area and a peripheral area surrounding the display area;

a thin-film transistor disposed on the display area of the substrate; and a pixel electrode disposed on the thin-film transistor and electrically connected to the thin-film transistor, the pixel electrode including:

a lower layer including titanium nitride (TiN);

an intermediate layer disposed on the lower layer and including an aluminum alloy; and an upper layer disposed on the intermediate layer and consisting of titanium oxide ($TiO_x$).

2. The display device of claim 1, further comprising a pad portion disposed on the peripheral area of the substrate and including a first pad electrode layer and a second pad electrode layer disposed on the first pad electrode layer, wherein the second pad electrode layer includes a same material as a material of the lower layer.

3. The display device of claim 2, wherein the second pad electrode layer contacts the first pad electrode layer.

4. The display device of claim 2, wherein the thin-film transistor includes a source region and a drain region on the substrate, a gate electrode, a source electrode electrically connected to the source region, and a drain electrode electrically connected to the drain region, wherein the first pad electrode layer includes a same material as a material of the source electrode and the drain electrode.

5. The display device of claim 4, wherein the lower layer contacts the source electrode or the drain electrode.

6. The display device of claim 1, wherein the intermediate layer includes an aluminum-nickel-lanthanum alloy (Al—Ni—La alloy) or an aluminum-titanium alloy (Al—Ti alloy).

7. The display device of claim 6, wherein, in the Al—Ni—La alloy, a sum of an atomic ratio of Ni and an atomic ratio of La is in a range of 0.01 at % or more and less than 0.1 at %.

8. The display device of claim 6, wherein, in the Al—Ti alloy, an atomic ratio of Ti is in a range of 0.01 at % or more and less than 0.1 at %.

9. The display device of claim 1, further comprising:

an emission layer disposed on the pixel electrode;

an opposite electrode disposed on the emission layer; and a thin-film encapsulation layer disposed on the opposite electrode.

10. The display device of claim 9, further comprising red, green and blue color filters disposed on the thin-film encapsulation layer.

11. The display device of claim 9, wherein the emission layer is unitary on the substrate.

12. The display device of claim 1, wherein the substrate includes a semiconductor substrate.

13. A display device comprising:

a substrate including a display area and a peripheral area surrounding the display area;

a thin-film transistor disposed on the display area of the substrate;

a pixel electrode disposed on the thin-film transistor and electrically connected to the thin-film transistor, the pixel electrode including:

a lower layer including titanium nitride (TiN);

an intermediate layer disposed on the lower layer and including an aluminum alloy; and an upper layer disposed on the intermediate layer and consisting of titanium oxide ($TiO_x$); and a pad portion disposed on the peripheral area of the substrate, at least a portion of the pad portion including a same material as a material of the lower layer.

14. The display device of claim 13, wherein the pad portion includes a first pad electrode layer and a second pad electrode layer disposed on the first pad electrode layer.

15. The display device of claim 14, wherein the thin-film transistor includes a source region and a drain region on the substrate, a gate electrode, a source electrode electrically connected to the source region, and a drain electrode electrically connected to the drain region, wherein the first pad electrode layer includes a same material as a material of the source electrode and the drain electrode, and the second pad electrode layer includes a same material as the material of the lower layer.

16. The display device of claim 13, wherein the intermediate layer includes an aluminum-nickel-lanthanum alloy (Al—Ni—La alloy) or an aluminum-titanium alloy (Al—Ti alloy).

17. The display device of claim 16, wherein, in the Al—Ni—La alloy, a sum of an atomic ratio of Ni and an atomic ratio of La is in a range of 0.01 at % or more and less than 0.1 at %.

18. The display device of claim 16, wherein, in the Al—Ti alloy, an atomic ratio of Ti is in a range of 0.01 at % or more and less than 0.1 at %.

19. An electronic device comprising:

a display device comprising:

a substrate including a display area and a peripheral area surrounding the display area;

a thin-film transistor disposed on the display area of the substrate; and a pixel electrode disposed on the thin-film transistor and electrically connected to the thin-film transistor, the pixel electrode including:

a lower layer including titanium nitride (TiN);

an intermediate layer disposed on the lower layer and including an aluminum alloy; and an upper layer disposed on the intermediate layer and consisting of titanium oxide (TiOx).

* * * * *